United States Patent
Kienzle et al.

(12) 
(10) Patent No.: US 6,642,525 B2
(45) Date of Patent: Nov. 4, 2003

(54) PARTICLE-OPTICAL COMPONENT AND SYSTEM COMPRISING A PARTICLE-OPTICAL COMPONENT

(75) Inventors: Oliver Kienzle, Aalen (DE); Holger Weigand, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 09/949,193

(22) Filed: Sep. 7, 2001

(65) Prior Publication Data

US 2002/0084422 A1 Jul. 4, 2002

(30) Foreign Application Priority Data

Sep. 7, 2000 (DE) .......................... 100 44 199

(51) Int. Cl.⁷ .................. H01J 37/00; H01J 37/141
(52) U.S. Cl. ............................... 250/396 ML
(58) Field of Search ................. 250/396 ML

(56) References Cited

U.S. PATENT DOCUMENTS

| | | | | |
|---|---|---|---|---|
| 3,984,687 A | * | 10/1976 | Loffler et al. | 250/396 ML |
| 4,376,249 A | | 3/1983 | Pfeiffer et al. | 250/396 ML |
| 4,525,629 A | | 6/1985 | Morita et al. | 250/396 ML |
| 4,544,846 A | | 10/1985 | Langner et al. | 250/396 ML |
| 4,882,486 A | | 11/1989 | Kruit | 250/305 |
| 4,929,838 A | | 5/1990 | Yasuda et al. | 250/492.2 |
| 4,945,246 A | | 7/1990 | Davis et al. | 250/492.2 |
| 4,977,324 A | | 12/1990 | Kruit et al. | 250/396 ML |
| 5,258,246 A | | 11/1993 | Berger et al. | 430/4 |
| 5,264,706 A | | 11/1993 | Oae et al. | 250/492.2 |
| 5,285,074 A | | 2/1994 | Haire et al. | 250/396 R |
| 5,382,498 A | | 1/1995 | Berger | 430/296 |
| 5,389,858 A | | 2/1995 | Langner et al. | 315/370 |
| 5,466,904 A | * | 11/1995 | Pfeiffer et al. | 219/121.25 |
| 5,481,164 A | | 1/1996 | Langner et al. | 315/370 |
| 5,523,580 A | | 6/1996 | Davis | 250/505.1 |
| 5,530,252 A | * | 6/1996 | Petric | 250/396 ML |
| 5,545,902 A | | 8/1996 | Pfeiffer et al. | 250/492.2 |
| 5,633,507 A | | 5/1997 | Pfeiffer et al. | 250/492.23 |

(List continued on next page.)

FOREIGN PATENT DOCUMENTS

| DE | 100 44 199 A1 | 6/2002 | ......... H01J/37/147 |
|---|---|---|---|
| EP | 0 969 326 A2 | 1/2000 | |

OTHER PUBLICATIONS

Xieqing Zhu et al., "Analysis of Off–Axis Shaped Beam Systems for High Throughput Electron Beam Lithography", SPIE vol. 3155, pp. 47–60 (1997).

*Primary Examiner*—John R. Lee
*Assistant Examiner*—James J Leybourne
(74) *Attorney, Agent, or Firm*—Rosenthal & Osha L.L.P.

(57) ABSTRACT

A magnetic lens assembly for providing a magnetic deflection field for a beam of charged particles is disclosed. The assembly includes a focusing lens device for providing a magnetic field which has substantially rotational symmetry in respect of a symmetry axis of the assembly and acts on the beam traversing the magnetic field as a focusing lens with an optical axis, and includes an axis shifting device for producing a corrective magnetic field which is superposable on the magnetic field provided by the focusing lens device and acts on the beam such that the optical axis is shiftable parallel to the symmetry axis of the assembly. The axis shifting device includes a first set of axially spaced apart rings which are positioned concentrically in respect of the symmetry axis and are made of a material which is substantially not electrically conductive and has a high magnetic permeability. At least one axis shifting coil is provided with a plurality of current conductor windings for producing the corrective magnetic field. The current conductor windings of the axis shifting coil engage around at least one of the rings of the first ring set.

64 Claims, 10 Drawing Sheets

U.S. PATENT DOCUMENTS

| | | | |
|---|---|---|---|
| 5,635,719 A | 6/1997 | Petric | 250/396 ML |
| 5,674,413 A | 10/1997 | Pfeiffer et al. | 219/121.25 |
| 5,708,274 A | 1/1998 | Langner et al. | 250/396 ML |
| 5,747,814 A | 5/1998 | Gordon et al. | 250/398 |
| 5,747,819 A | 5/1998 | Nakasuji et al. | 250/492.23 |
| 5,757,010 A | 5/1998 | Langner | 250/396 ML |
| 5,770,863 A | 6/1998 | Nakasuji | 250/492.2 |
| 5,793,048 A * | 8/1998 | Petric et al. | 250/396 ML |
| 5,825,043 A | 10/1998 | Suwa | 250/548 |
| 5,850,083 A | 12/1998 | Koikari et al. | 250/396 R |
| 5,952,667 A | 9/1999 | Shimizu | 250/492.2 |
| 5,977,550 A | 11/1999 | Nakasuji | 250/492.2 |
| 5,994,708 A | 11/1999 | Nakasuji | 250/492.23 |
| 6,005,250 A | 12/1999 | Stickel et al. | 250/396 R |
| 6,023,067 A | 2/2000 | Stickel et al. | 250/396 R |
| 6,060,711 A | 5/2000 | Shimizu | 250/358 |
| 6,064,071 A | 5/2000 | Nakasuji | 250/492.23 |
| 6,066,853 A | 5/2000 | Nakasuji | 250/398 |
| 6,066,855 A | 5/2000 | Simizu | 250/492.22 |
| 6,069,684 A | 5/2000 | Golladay et al. | 355/53 |
| 6,078,054 A | 6/2000 | Nakasuji | 250/396 R |
| 6,078,382 A | 6/2000 | Nakasuji | 355/55 |
| 6,420,713 B1 * | 7/2002 | Stickel et al. | 250/396 ML |

* cited by examiner

PARTICLE-OPTICAL COMPONENT AND SYSTEM COMPRISING A PARTICLE-OPTICAL COMPONENT

BACKGROUND OF INVENTION

1. Field of the Invention

The present invention relates to a particle-optical component which images or deflects a beam of charged particles, and the invention further relates to a system which comprises such a particle-optical component. The invention relates in particular to a magnetic lens assembly, the optical axis of which can be shifted relative to a geometric symmetry axis of the assembly. Moreover, the invention relates in particular to a projection system for transferring a pattern defined on a mask onto a particle-sensitive substrate by means of a beam of charged particles, in particular to an electron beam projection lithographic system. Furthermore, the invention relates in particular also to an electron microscopy system.

2. Background

Magnetic lens configurations (or assemblies), which act on charged particles of a given energy like a lens having a focal length f, are known in the prior art. With such a magnetic lens, it is possible to focus a parallel particle beam in an image plane positioned away from the lens by a distance f. The imaging quality of the bundle of beams passing centrally through a symmetry axis of the magnetic lens is comparatively good. However, if a bundle of beams to be imaged passes decentrally through the magnetic lens, an imaging in the image plane results in aberrations that are too high for practical applications.

The article 'MOL (Moving Objective Lens)', Optik 48 (1977), pages 255 et seq., by E. Goto et al., proposes shifting the optical axis of the lens from the symmetry axis of the lens by means of a corrective magnetic field such that it coincides with the decentral particle beam.

U.S. Pat. No. 4,376,249 discloses a concrete realization of such a lens as proposed by E. Goto and is referred to therein as 'variable axis lens'. The magnetic lens disclosed therein comprises two pole ends which are axially spaced apart from one another relative to a geometric symmetry axis of the lens and are facing radially inwardly to the symmetry axis. Positioned radially inside these pole ends is respectively provided a magnet assembly for producing a magnetic field such that the optical axis can be shifted away from the symmetry axis. The lengths and diameters of the appertaining coils are so dimensioned that they produce a magnetic field transverse to the symmetry axis whose magnitude is proportional to the first derivative of the axial component of the magnetic field of the lens along the symmetry axis.

It has been found that for certain applications the conventional assembly known from U.S. Pat. No. 4,376,249 does not provide the necessary precision.

European patent 0 969 326 A2, the contents of which is fully incorporated herein by reference, discloses a lithographic apparatus for transferring a pattern defined on a mask to a radiation-sensitive substrate by means of an electron projection system. To this end, the mask is scanned in stripes by means of an electron beam having a well-defined beam cross-section, wherein a portion of the beam which passes unscatterd through the mask is likewise imaged in stripes onto the substrate. In order to ensure sufficient exposure quality, the beam cross-section must be defined with sufficient accuracy in the mask plane. If this is not the case, the substrate is either underexposed or overexposed at certain points.

It is desirable to have an apparatus capable of deflecting a beam of charged particles with less abberations.

SUMMARY OF INVENTION

One aspect of the invention relates to a deflection arrangement (or assembly) for a beam of charged particles which is provided such that a beam cross-section is transferred from an object plane of the arrangement to an image plane, wherein after projection the beam direction the beam cross-sections in the object plane and the image plane are shiftable relative to one another transverse to the beam direction.

The deflection arrangement comprises a magnetic lens doublet having two magnetic lenses. The two magnetic lenses are positioned relative to one another such that an object positioned in a front focal plane of the first lens, also referred to as collimator lens, is imaged to infinity. The second magnetic lens, also referred to as projection lens, is positioned such that its front focal plane coincides with the rear focal plane of the first magnetic lens. The second magnetic lens thus focuses the beam collimated by the first magnetic lens to the rear focal plane thereof which is thus the image plane for the doublet.

In one embodiment, a beam shifting arrangement is positioned between the first magnetic lens and the second magnetic lens providing such a magnetic field that a beam entering the beam shifting arrangement emerges from the beam shifting arrangement shifted parallel to its original beam direction.

Other aspects of the invention relate to electron microscopy systems employing a deflection arrangement for a beam of charged particles according to the embodiment of the invention, e.g., a scanning electron microscope (SEM) and a transmission electron microscope (TEM). In the scanning electron microscope electrons emitted from an electron source are focused onto a sample mounted on a sample holder by means of a focusing assembly, and electrons emerging from the same due to an interaction of the electrons focused onto the sample are detected by a detector. The deflection arrangement then forms part of the focusing assembly and enables the electron beam to be precisely focused onto the sample, with a large area scanned by the electron beam, i.e., a large observable image field, being provided.

The transmission electron microscope comprises an electron source for a large area illumination of a sample mounted on a sample holder as well as a position sensitive detector onto which transmission electrons emerging from the sample are imaged by a lens arrangement. In this case, the deflection arrangement forms part of the lens arrangement and enables the electrons emerging from the sample of an arbitrary partial field of a large area to be imaged with high imaging quality onto the position sensitive detector.

Another aspect of the invention relates to a magnetic lens arrangement which is referred to in the prior art as 'moving objective lens' or 'variable axis lens'. Such a magnetic lens arrangement comprises in particular a focusing lens device for providing a magnetic field which is substantially rotationally symmetrical in respect of a symmetry axis of the arrangement, said magnetic field acting on the beam passing through said magnetic field as a focusing lens with an optical axis, said magnetic lens arrangement comprising moreover preferably an axis shifting device for producing a corrective magnetic field which is superposable on the magnetic field provided by the focusing lens device and acts on the beam such that the optical axis is shiftable parallel to the symmetry axis of the arrangement. As a result, the same focusing action is imparted on a particle beam entering the lens shifted from the (geometric) symmetry axis of the lens as on a particle beam entering the lens centrally, so that aberrations resulting from the decentral entry into the lens device being largely suppressed.

Other aspects and advantages of the invention will be apparent from the following description and the appended claims.

DETAILED DESCRIPTION

Figure 1:
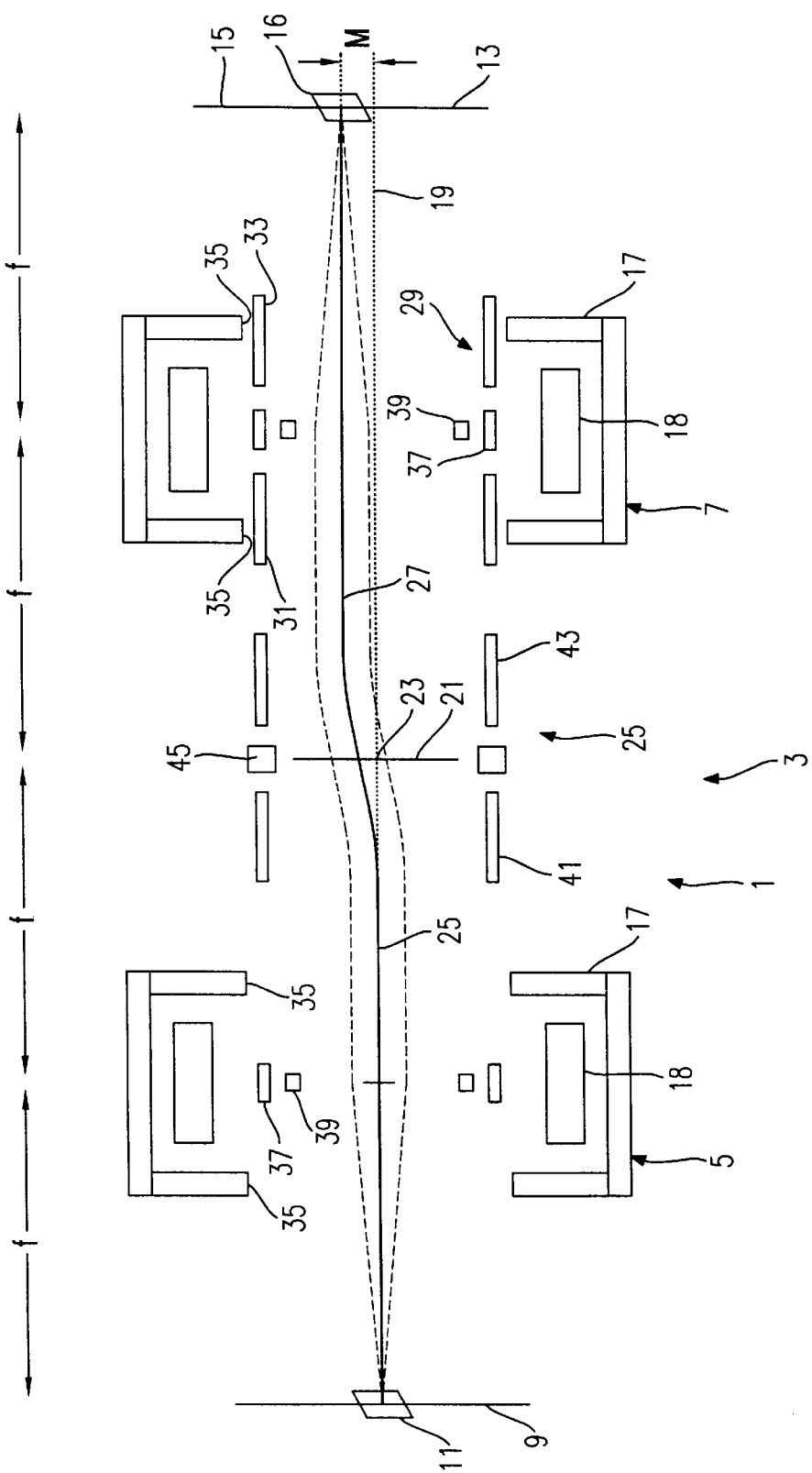
FIG. 1 schematically depicts the structure of a deflection arrangement according to one embodiment of the invention as well as an optical beam path extending therethrough.

Embodiments of the invention relate to deflection arrangements (or assemblies) for beams of charged particles. In some embodiments, a deflection arrangement is provided such that a beam cross-section is transferred from an object plane of the arrangement to an image plane, wherein after projection in the beam direction the beam cross-sections in the object plane and the image plane are shiftable relative to one another transverse to the beam direction.

For this purpose, the deflection arrangement comprises a magnetic lens doublet having two magnetic lenses. The two magnetic lenses are positioned relative to each other such that an object positioned in a front focal plane of the first lens, also referred to as a collimator lens, is imaged to infinity. The second magnetic lens, also referred to as a projection lens, is positioned such that its front focal plane coincides with the rear focal plane of the first magnetic lens. The second magnetic lens thus focuses the beam collimated by the first magnetic lens to the rear focal plane of the second lens which is thus the image plane for the doublet (the lens pair). A magnification of the magnetic lens doublet results from the relation of the focal lengths f1 and f2 of the first magnetic lens and the second magnetic lens, respectively. Moreover, the distance between object and image plane is twice the sum of the two focal lengths f1 and f2.

The two magnetic lenses are 'symmetrical' relative to a symmetry plane which is spaced apart from the object plane by a distance which is twice the focal length of the first magnetic lens and which is spaced apart from the image plane by a distance which is twice the focal length of the second magnetic lens. The two magnetic lenses are symmetrical to the symmetry plane not in a strict mathematical sense, but in respect of a beam path through the lenses, and that taking into consideration the magnification. For example, the sizes of the lenses scale with the focal lengths thereof. Currents and/or magnetic fields through the coils thereof, in turn, are equal in magnitude and, in particular, these currents produce oppositely directed magnetic fields, which is then referred to as 'antisymmetrical doublet'.

According to one embodiment of the invention, a beam shifting arrangement is positioned between the first magnetic lens and the second magnetic lens providing such a magnetic field that a beam entering the beam shifting arrangement emerges from the beam shifting arrangement shifted parallel to its original beam direction.

This beam shifting arrangement is preferably positioned symmetrically, in a mathematical sense, to the symmetry plane of the doublet, wherein the components of the beam shifting arrangement have likewise geometric symmetry in respect to this symmetry plane. As the beam shifting arrangement is preferably positioned in the area of the symmetry plane of the doublet, a substantially equal lateral shift is imparted to all partial beams passing through the doublet, because the doublet has a crossover point in the symmetry plane.

Due to the beam shifting arrangement being provided in the area of the symmetry plane, the magnetic lens doublet is capable of manipulating beams which are shifted from a (geometric) symmetry axis of the magnetic lenses. For example, beams entering the beam shifting arrangement which are shifted from the symmetry axis can be returned to the symmetry axis, beams entering the beam shifting arrangement on the symmetry axis can emerge from the beam shifting arrangement shifted from the symmetry axis and be further imaged by the second lens of the doublet, or shifted beams which enter the beam shifting arrangement can emerge again from the beam shifting arrangement with the same or different shift.

If, for example, it is desired for a beam to emerge from the deflection arrangement shifted from the symmetry axis and to be imaged by the second magnetic lens as free of aberrations as possible, said second focusing lens preferably exhibits a property which is referred to in the prior art as 'moving objective lens' or 'variable axis lens'. In particular, the second magnetic lens comprises an axis shifting device which provides a corrective magnetic field which can be superposed on the focusing magnetic field produced by the magnetic lens of the doublet. The superposed magnetic field acts on the beam entering the magnetic lens shifted from the symmetry axis such that the optical axis of the focusing magnetic lens is likewise shifted parallel to the symmetry axis thereof.

If it is desired for the doublet to also manipulate beams which enter the deflection arrangement shifted from the symmetry axis, the first lens of the doublet preferably comprises such an axis shifting device as well.

In some embodiments, the deflection arrangement forms part of a projection system for transferring a pattern defined on a mask to a radiation-sensitive substrate by means of a beam of charged particles. Such a projection system comprises a source of charged particles, a beam shaping aperture for shaping a cross-section of the particle beam, a first particle-optical imaging apparatus for imaging the image shaping aperture onto the mask and a second particle-optical imaging apparatus for imaging the mask onto the substrate. Preferably, the first particle-optical imaging device comprises a deflection arrangement according to one embodiment of the invention, the beam shaping aperture being positioned in the object plane and the mask being positioned in the image plane of the magnetic lens doublet. This enables one to provide the beam cross-section defined by the beam shaping aperture with increased edge sharpness, i.e., with a steep transition between a high particle intensity within the beam cross-section to a particle intensity of essentially zero outside the beam cross-section.

Furthermore, in some embodiments, the deflection arrangement is employed in an electron microscopy system, in particular in a scanning electron microscope (SEM) and a transmission electron microscope (TEM). In the scanning electron microscope electrons emitted from an electron source are focused onto a sample mounted on a sample holder by means of a focusing assembly, and electrons emerging from the same due to an interaction of the electrons focused onto the sample are detected by a detector. The deflection arrangement then forms part of the focusing assembly and enables the electron beam to be precisely focused onto the sample, with a large area scanned by the electron beam, i.e., a large observable image field, being provided.

The transmission electron microscope comprises an electron source for a large area illumination of a sample mounted on a sample holder as well as a position sensitive detector onto which transmission electrons emerging from the sample are imaged by a lens arrangement. In this case, the deflection arrangement forms part of the lens arrangement and enables the electrons emerging from the sample of an arbitrary partial field of a large area to be imaged with high imaging quality onto the position sensitive detector.

Some embodiments of the invention relate to a magnetic lens arrangement (or assembly) which is referred to in the prior art as 'moving objective lens' or 'variable axis lens'. Such a magnetic lens arrangement comprises in particular a focusing lens device for providing a magnetic field which is substantially rotationally symmetrical in respect of a symmetry axis of the arrangement, said magnetic field acting on the beam passing through said magnetic field as a focusing lens with an optical axis, said magnetic lens arrangement comprising moreover preferably an axis shifting device for producing a corrective magnetic field which is superposable on the magnetic field provided by the focusing lens device and acts on the beam such that the optical axis is shiftable parallel to the symmetry axis of the arrangement. As a result, the same focusing action is imparted on a particle beam entering the lens shifted from the (geometric) symmetry axis of the lens as on a particle beam entering the lens centrally, so that aberrations resulting from the decentral entry into the lens device being largely suppressed.

According to embodiments of the invention, the corrective magnetic field is provided by an axis shifting coil comprising a plurality of current conducting windings positioned within the magnetic field of the focusing lens device. In this respect, it is essential that the corrective magnetic field, which changes in time as the axis shift changes in terms of time, does not interfere with the focusing magnetic field of the focusing lens device. This is accomplished in that a first set of axially spaced apart rings which are made of a material which is substantially not electrically conductive and has a high magnetic permeability is positioned within the magnetic field of the focusing device concentrically to the symmetry axis. The permeability number $\mu_r$ of said material is preferably higher than 10, in particular higher than 100 and more preferred higher than 1000. The electric resistance of the material is preferably more than $10^3$ ohm/m ($\Omega$/m), preferably more than $10^6$ $\Omega$/m and more preferred more than $10^{10}$ $\Omega$/m.

Preferably, the rings of the first set have substantially the same diameter and are preferably spaced apart from one another by the same distance.

The set of rings of highly permeable material is transmissive to magnetic field components having radial and axial symmetry to such an extent that the focusing magnetic field of the focusing lens device is provided at high quality within the rings at the locations which are traversed by the particle beam. The current conducting windings of the axis shifting coil engage in each case around a ring or a plurality of rings of the set of rings, wherein the high magnetic permeability again contributes to provide a corrective magnetic field of sufficient magnitude, with limited currents passing through the axis shifting coil.

Preferably, the current conducting windings of the axis shifting coil engage around two or three or more rings.

The corrective magnetic field is preferably a magnetic dipole field oriented transverse to the symmetry axis, whose component transverse to the symmetry axis has a field strength distribution along the symmetry axis which is approximately proportional to the first derivative of the focusing lens device's magnetic field component parallel to the symmetry axis. Such a field strength distribution of the corrective magnetic field is achievable by appropriately dimensioning the rings and the axis shifting coil.

Preferably, the focusing lens device comprises two axially spaced apart pole ends radially facing towards the symmetry axis. Associated to each pole end is at least one axis shifting coil which is positioned radially inside the same. Preferably, a single axis shifting coil is associated to each pole end.

Preferably, a second set of rings which are made of a material which is substantially not electrically conductive and has a high magnetic permeability is provided radially outside the rings of the first set of rings. The rings of the second set of rings are likewise positioned concentrically in respect of the symmetry axis and axially spaced apart from one another. The rings of the second set serve to radially shield the corrective magnetic field produced by the axis shifting coil from the outside so that the same does substantially not influence the focusing lens device. In particular, a magnetic field produced by the axis shifting coil is thereby prevented from inducing eddy currents in the focusing lens device. The rings of the second set of rings are made of the same or similar material as the rings of the first set of rings.

The magnetic lens arrangement comprises preferably a stigmator coil for correcting aberrations, the current conducting windings of the stigmator coil being likewise wound onto rings preferably of the first set of rings. The stigmator coil provides for a magnetic quadrupole field whose effect on the focusing lens device is likewise preferably reduced by rings of the second set of rings positioned radially outside the stigmator coil.

Moreover, the magnetic lens arrangement comprises dynamic focusing coils comprising windings which engage around the symmetry axis. These windings are preferably positioned radially inside the current conducting windings of the stigmator coils and/or radially inside the rings of the first set of rings.

The magnetic lens arrangement is preferably used in a projection system for transferring a pattern defined on a mask to a particle-sensitive substrate or an electron microscopy system by means of a beam of charged particles.

The present invention will be described below with reference to exemplary embodiments and the accompanying drawings.

FIG. 1 shows a deflection arrangement 1 according to the present invention. It comprises a magnetic lens doublet 3 with two magnetic lenses 5 and 7, each having a focal length f of 180 mm for electrons with an energy of 100 keV. The magnetic lens doublet 3 serves to image a beam shaping aperture 11 positioned in an object plane 9 of the doublet 3 onto a mask 15 positioned in an image plane 13 of the doublet 3. The beam shaping aperture 11 defines a distinctly outlined illuminated field 16 on the mask 15. Each of the magnetic lenses 5 and 7 comprises a coil 18 and pole pieces 17 in order to each provide a focusing magnetic field with the focal length f. The bore diameter of the poles is 80 mm and the pole piece gap is 40 mm.

The magnetic lenses 5 and 7 are positioned spaced apart from one another by a distance of 2 f and symmetrically around with respect to a symmetry axis 19 of the doublet 3. The center of the beam shaping aperture 11 is likewise positioned on the symmetry axis 19.

Figure 5:
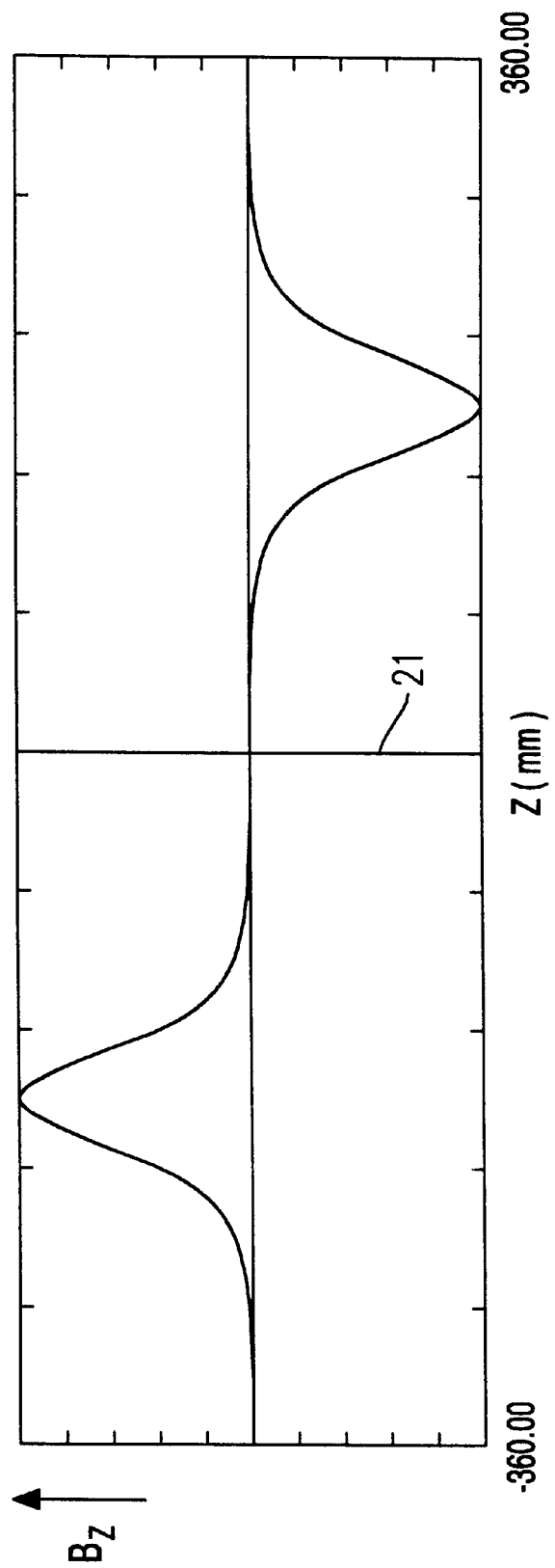
FIG. 5 graphically illustrates a field strength distribution of an axial component of a magnetic field produced by a focusing lens of the deflection arrangement of FIG. 1.

The field strength distribution of the axial component $B_z$, oriented in the direction of the symmetry axis 19 of the magnetic field produced by the lenses 5 and 7, is shown in FIG. 5 in arbitrary units. The field strength distribution is such that a crossover point 23 is formed in a symmetry plane 21 of the doublet 3 for an electron beam passing through the doublet (antisymmetrical doublet).

In the area of the symmetry plane 21 there is furthermore provided a deflection device 25 for shifting an electron beam passing centrally through the lens 5 laterally from the symmetry axis 19 by an amount M. The particle beam 27 shifted from the symmetry axis 19 by the amount M by the deflection unit 25 thus enters the lens 7 of the doublet 3 decentrally, with its shift from the symmetry axis 19 by the amount M being maintained, so that it impinges onto the mask 15 likewise shifted by the amount M. However, the beam 27 is nevertheless focused by the lens 7 onto the image plane 13. The magnetic field required for this purpose is provided in that a corrective magnetic field is superposed on the focusing field of lens 7 provided by the coil 18 and the pole pieces 17, said corrective magnetic field being produced by an axis shifting device 29. The axis shifting device 29 comprises two deflection coils 31 and 33, each of which is positioned radially inside ends 35 of the pole piece 17 of the lens 7, said ends being disposed radially inwardly to the symmetry axis 19.

The deflection coils 31 and 33 provide a magnetic field which is oriented transverse to the symmetry axis 19 and has a magnitude which is proportional to the first derivative of the axial component shown in FIG. 5 of the magnetic field produced by the lens 7. Such a field strength distribution of the corrective magnetic field is accomplishable by an appropriate selection of the geometry of the deflection coils 31 and 33.

The corrective magnetic field is moreover proportional to the amount of the axis shift M caused by the beam shifting arrangement and is oriented in the direction thereof.

Furthermore, each of the lenses 5 and 7 comprises a stigmator coil 37 for correcting an astigmatic aberration of lenses 5 and 7, respectively, as well as a dynamic focusing coil 39 for correcting a malfocus of the image field curvature of lenses 5 and 7, respectively.

The beam shifting arrangement 25 comprises two deflection coils 41 and 43 which are symmetrical in respect of the symmetry plane 21 as well as a further dynamic focusing coil 45 positioned on the symmetry plane 21.

Possible winding configurations of the deflection coils 31, 33, 41 and 43 are schematically shown in FIG. 3. FIG. 3a shows configurations of windings as a toroidal coil, FIG. 3b shows a configuration as a saddle coil and FIG. 3c shows a configuration as compound saddle coil.

Figure 2:
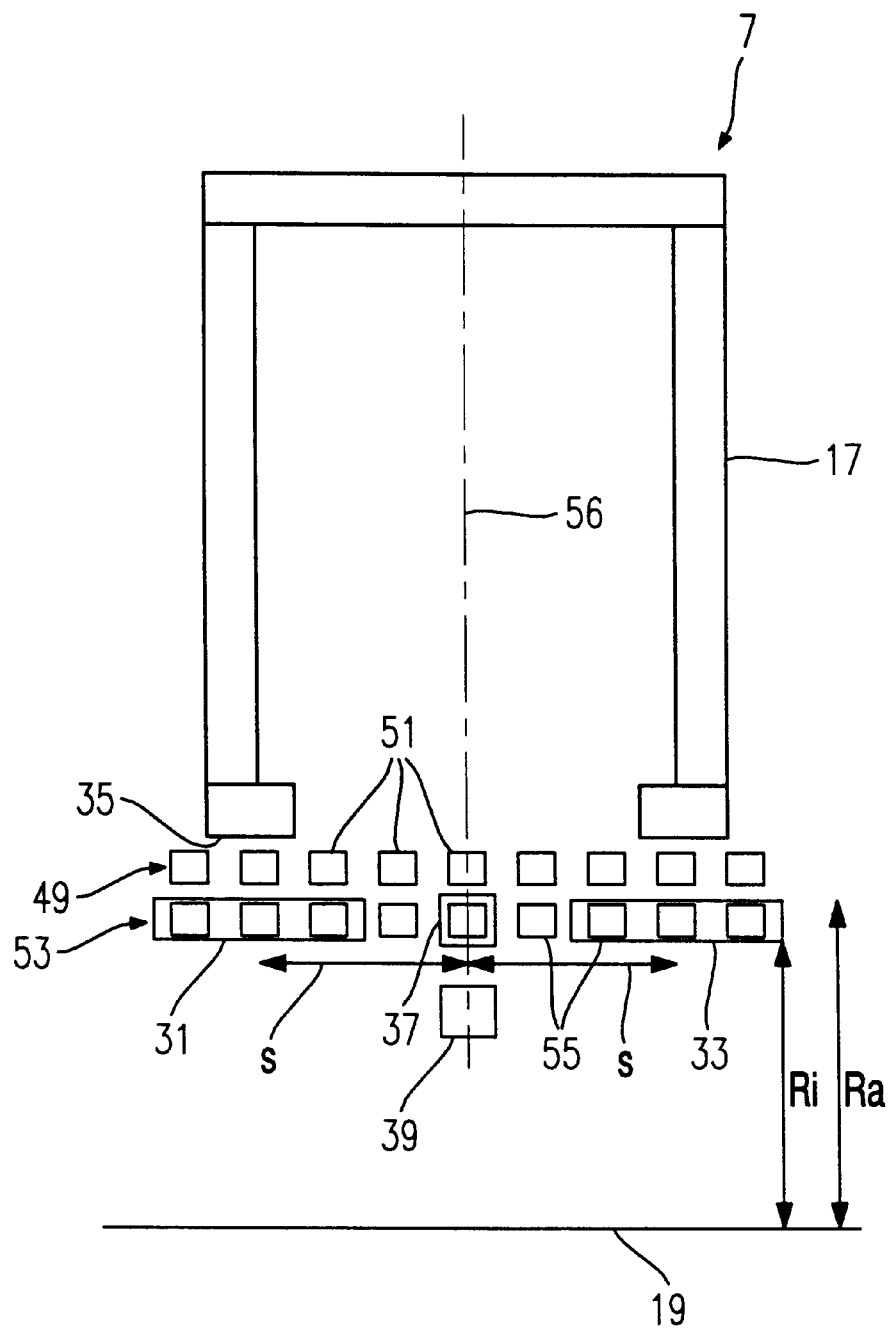
FIG. 2 schematically depicts a magnetic lens arrangement included in the deflection arrangement of FIG. 1.
Figure 3A:
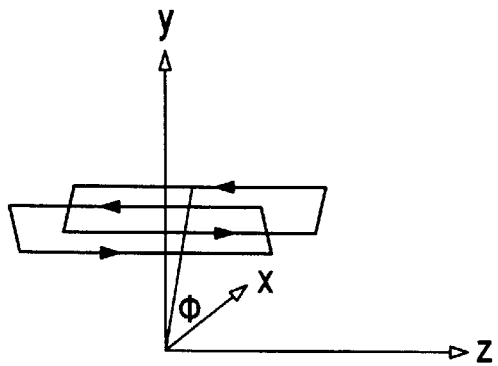
FIGS. 3a, 3b, 3c show different types of coils of an axis shifting device shown in FIG. 2.
Figure 3A:
Figure 3B:
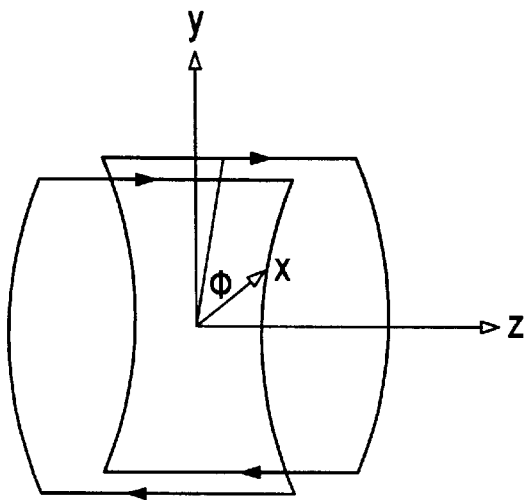
Figure 3C:
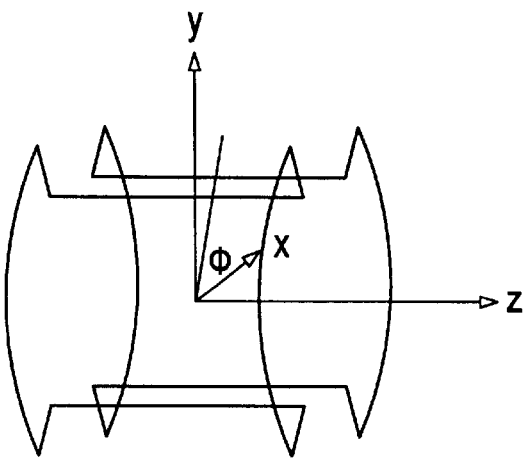

As it is apparent from FIG. 2, a stack 49 of nine ferrite rings 51 of equal diameter are equidistantly positioned radially inside the pole ends 35 of the poles 17 of the lens 7. Radially inside the stack 49 of the nine ferrite rings 51 there is provided a further stack 53 of likewise nine ferrite rings 55 which are again of equal diameter. The ferrite rings 55 of the inner set 53 have an inner radius Ri of 28 mm and an outer radius Ra of 32 mm.

Each of the deflection coils 31 and 33 engages around the respective three axial outermost ferrite rings 55 of the inner stack 53, while the stigmator coil 37 engages, seen in axial direction, around the central ferrite ring 55 of the stack 53. The dynamic focusing coil 39 is positioned radially inside the inner stack 53 of ferrite rings 55. Each of the axial centers of the coils 31, 33 are spaced apart from a symmetry axis 56 of the lens 7 by an axial distance s of 23 mm; the axial length of each coil 31 and 33 is likewise 24 mm.

The distribution of the windings of the deflection coils 31 and 33 in circumferential direction of the ferrite rings 55 is evident from FIG. 4.

Figure 4A:
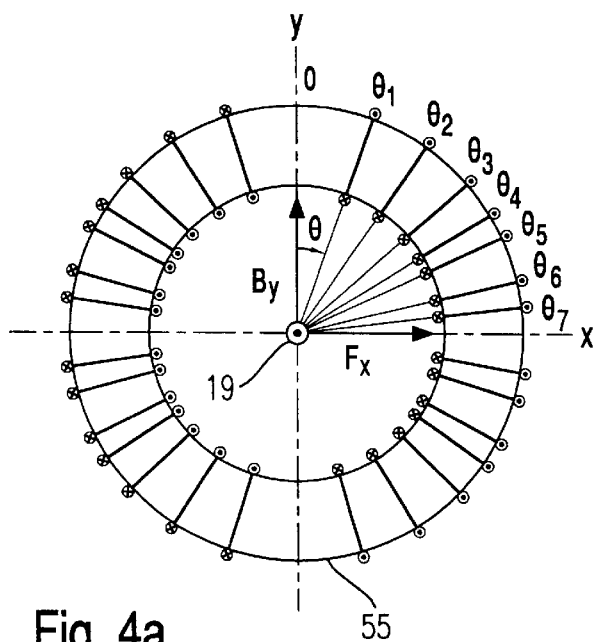
FIGS. 4a, 4b, 4c show an arrangement of current conducting windings of the axis shifting coil shown in FIG. 2 around the circumference of ferrite rings.
Figure 4B:
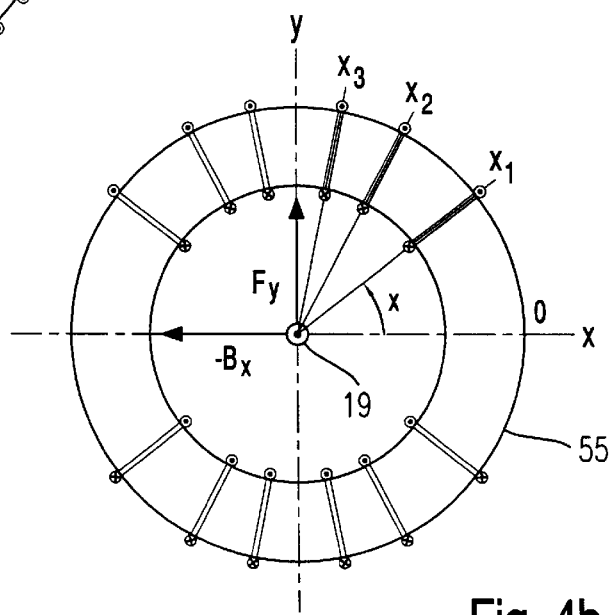
Figure 4C:
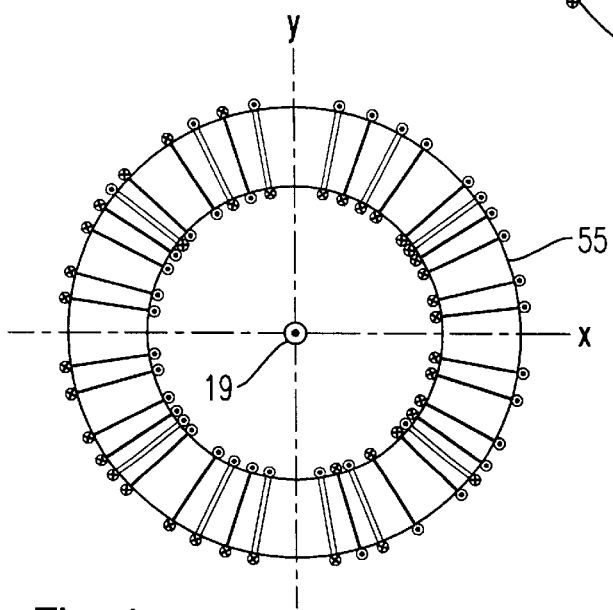

FIG. 4a shows the windings which serve to produce a magnetic dipole field $B_y$ oriented in y-direction, and FIG. 4b shows windings which serve to produce a dipole field $B_x$ oriented orthogonally thereto. FIG. 4c shows the combination of the windings shown in FIGS. 4a and 4b on the ferrite rings 55.

In order to configure the two lenses 5 and 7 as symmetrical as possible, two stacks of nine ferrite rings, as described above for the lens 7 but not shown in the drawings, are also provided radially inside the pole ends 35 of the lens 5. However, no deflection coils 31 and 33 are wound onto the radially inner one of the two stacks. Merely the stigmator coil 37 of the lens 5 is wound onto the central ferrite ring, seen in axial direction, of the radial inner stack of the lens 5.

Figure 8:
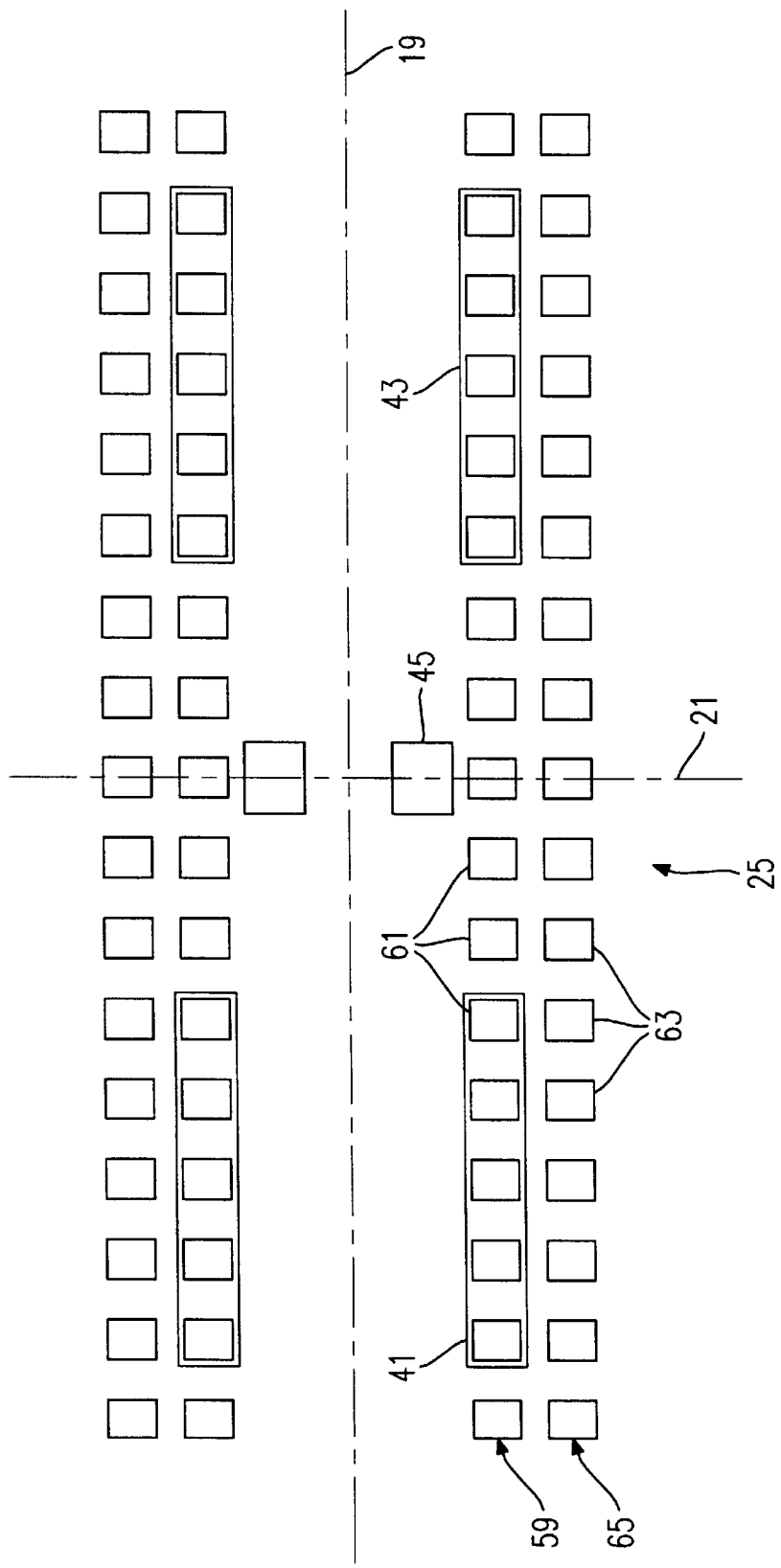
FIG. 8 schematically depicts in detail a beam shifting arrangement positioned between magnetic lenses of FIG. 1.

The arrangement of the coils 41 and 43 of the beam shifting arrangement 25 is shown in detail in FIG. 8. The beam shifting arrangement 25 comprises a set 59 of 17 ferrite rings 61 of equal diameter which are positioned equidistantly in axial direction and symmetrical to the symmetry plane 21. Radially outside each ferrite ring 61 there is positioned a ferrite ring 63 of larger diameter of a second set 65 of ferrite rings. The deflection coils 41 and 43 are wound on ferrite rings 61 of the radial inner set 59, with the winding configurations shown in FIGS. 3a to 3c being again possible. The distribution of the windings around the ferrite rings 61 in circumferential direction again corresponds to the configuration shown in FIG. 4. The windings of the deflection coils 41 and 43 engage, seen from the axial outside direction, around the second to sixth ferrite rings.

The further corrective coil 45 is positioned radially inside the stack 59 of ferrite rings 61.

Figure 6:
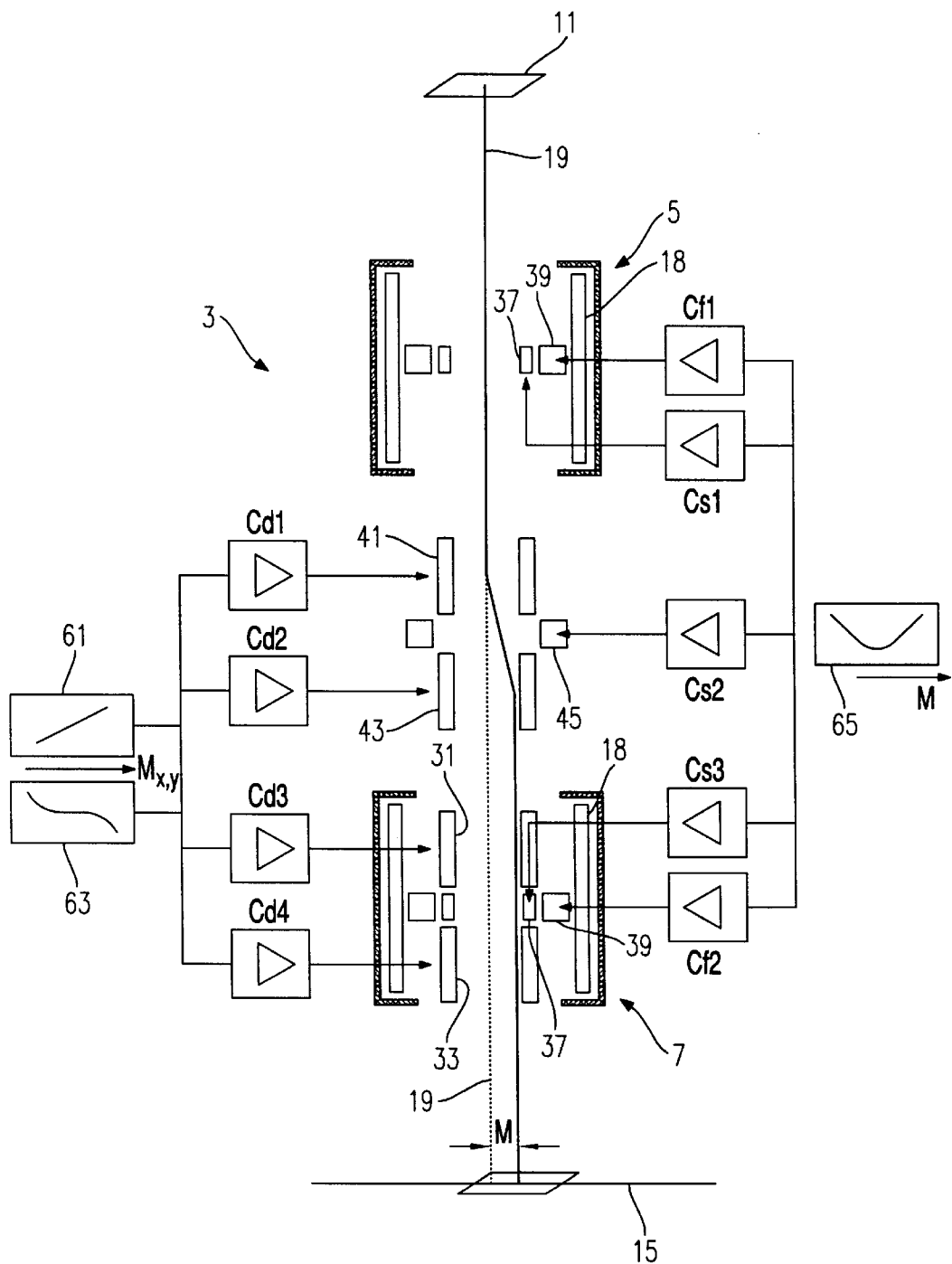
FIG. 6 shows a functional diagram for driving the various coils of the deflection arrangement of FIG. 1.

FIG. 6 shows a functional diagram for driving the individual coils of the deflection arrangement 1 shown in FIG. 1. The coils 18 of the lenses 5 and 7 of the doublet 3 are driven by a constant current so that each of the lenses 5 and 7 provides a focal length f of 180 mm for the electrons. In order to achieve the deflection M of the electron beam from the symmetry axis 19, the deflection coils 41 and 43 of the beam shifting arrangement 25 are driven by a current which has a proportional component 61 which is proportional to the deflection M. The proportionality constants are referred to in this case as Cd1 and Cd2.

In order to cause a shift of the optical axis of the lens 7 corresponding to the shift M of the beam 27, the coils 31 and 33 of the lens 7 are likewise driven by a current having a proportional component 61, the corresponding proportionality constants being designated by Cd3 and Cd4. In order to avoid distortion errors, the currents supplied to the deflection coils 41, 43, 31 and 33 further comprise a cubic component 63.

The currents supplied to the corrective coils 39, 45 as well as to the stigmators 37 exhibit a quadratic dependency 65 from the deflection M, the respective proportionality constants being designated by Cf1, Cs1, Cf2, Cs2 and Cs3.

The relations between the proportional constants Cd1, Cd2, Cd3 and Cd4 preferably satisfy the relation |Cd1/Cd2|= |Cd3/Cd4|=1, if the geometry of the arrangement is observed in the manufacture in ideal manner.

Figure 7:
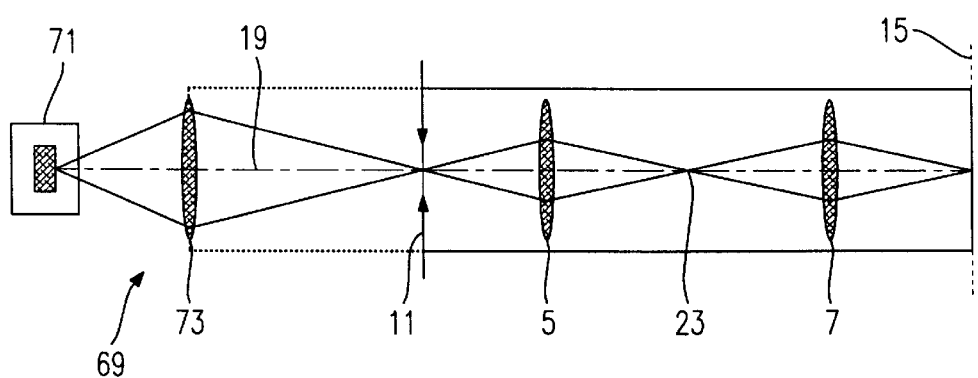
FIG. 7 schematically depicts the deflection arrangement shown in FIG. 1 including an illustration of the illumination of a beam shaping aperture.

FIG. 7 shows schematically an illumination system 69 for the beam shaping aperture 11 which is imaged by the doublet 3 of focusing lenses 5 and 7 as illuminated field 16 onto the mask 15. The imaging system 69 comprises an electron gun 71 and a focusing magnetic lens 73 which directs the electrons emitted from the electron gun 71 to the beam shaping aperture 11 such that the same is illuminated.

The described arrangement of the lens doublet 3, beam shifting arrangement 25 and axis shifting device 29 allows to image the beam shaping aperture 11 with very little distortions onto an illuminated field 16 on the mask 15, the illuminated field 16 being shiftable from the symmetry axis 19. An edge steepness (intensity increase of 20% to 80%) at the edges of the illuminated field 16 of 0.2 μm can be achieved. In particular, the illuminating beam 25, 27 passes orthogonally both through the field shaping aperture 11 as well as through the mask 15 (telecentricity).

The ring sets 49, 53, 59 and 65 may, for example, be manufactured as follows:

First of all, the desired number of ferrite rings of equal inner diameter and outer diameter and equal axial height are produced. Subsequently, a corresponding number of ceramic rings having the same diameter as the ferrite rings and of equal axial length are produced. The ferrite rings and ceramic rings are alternately assembled to a stack. It is favorable for the material used for the ceramic rings to have a high specific electric resistance and a magnetic permeability near to 1. For example, the glass ceramic material sold by the company Corning under the trade name Macor can be employed.

In the following, variants of the deflection arrangement as shown in FIGS. 1 to 8 are described. Components which correspond to each other in structure and function are designated by the same reference numerals as used in FIGS. 1 to 8. However, in order to distinguish the same they are supplemented by an additional letter. For the purpose of illustration, reference is made to the entire above description.

Figure 9:
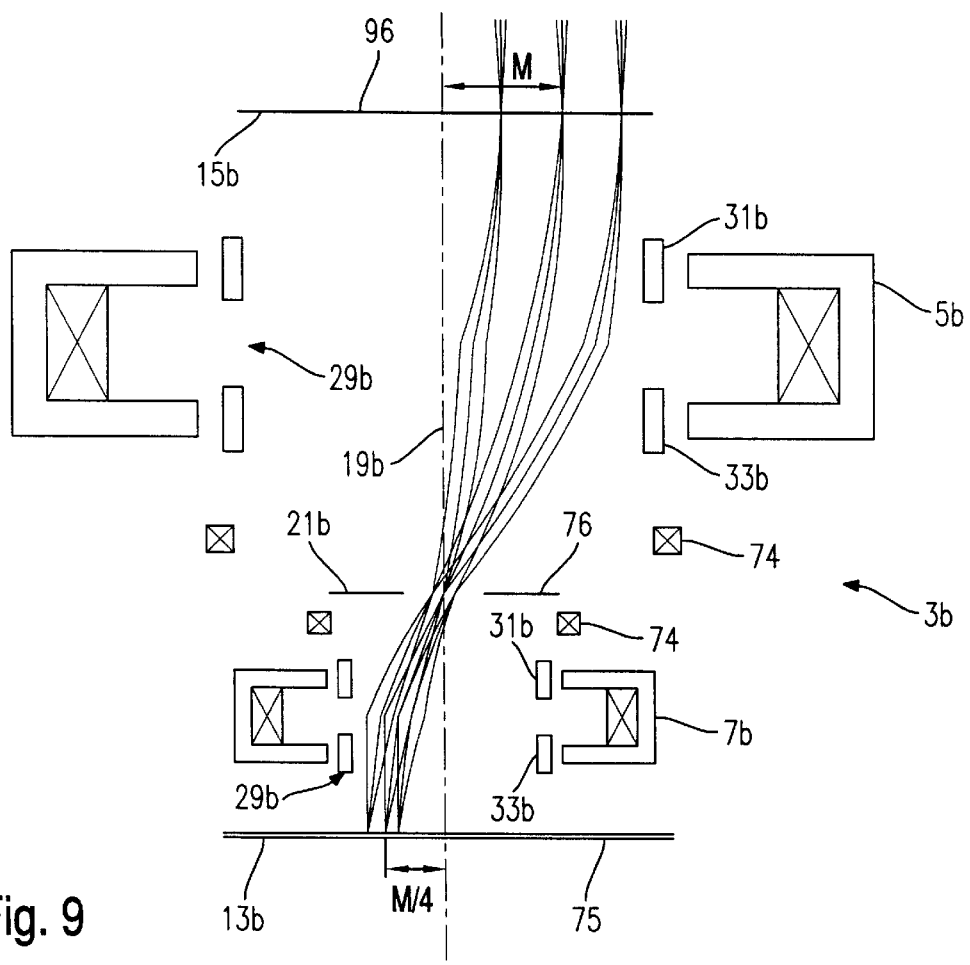
FIG. 9 schematically depicts the structure of a further embodiment of the deflection arrangement according to one embodiment of the invention as well as an optical beam path extending therethrough.

FIG. 9 shows a magnetic lens doublet 3b of focusing magnetic lenses 5b and 7b. The doublet 3b serves to image a mask 15b positioned in an object plane 9b of the doublet 3b onto a semiconductor wafer 75 positioned in an image plane 13b of the doublet. To accomplish such an imaging, an electron beam is directed onto the mask 15b, for which purpose the arrangement shown in FIG. 1 may be used, for example, which illuminates a well-defined field on the mask 15b by means of a beam shaping aperture. The electron beam is deflected relative to the symmetry axis 19 in order to move the illuminated field uniformly and in stripes over the mask 15b. FIG. 9 shows the optical beam path of a central beam of the illuminated field for three different deflection positions M.

The doublet 3b provides an image of the mask 15b on the wafer 75 which is reduced in size by a factor of 1:4. To this end, the two lenses 5b and 7b are 'symmetrical' relative to a symmetry plane 21b of the doublet 3b. This symmetry is not to be understood in a strictly geometric sense, but rather taking into consideration the reduction in size of 1:4, wherein the size relation of the two lenses 5b and 7b as well as the distances thereof from the symmetry plane 21b scale 1:4 as well.

Furthermore, two deflectors 74 are provided between the two lenses 5b and 7b to support the guidance of the beam in the optical beam path shown in FIG. 9.

Furthermore, an aperture stop 76 is provided in the symmetry plane 21b at which a crossover point of the doublet 3b is formed so that only those electrons impinge from the mask 15b on the wafer 75 which have substantially not been scattered by the mask. Accordingly, patterns provided as scattering structures on the mask 15b are transferred to the wafer 75.

As the electron beams shifted from the symmetry axis 19b by the amount M enter the lens 5b, said lens comprises an axis shifting device 29b with two axis shifting coils 31b and 33b so that the optical axis of the lens 5b is shifted from the symmetry plane 19b such that the central beam of the illuminated field, when passing through the lens 5b, coincides with the optical axis of the lens 5b. As a result, the focusing effect of the lens 5b on the partial beams of the illuminated field is maintained, while aberrations caused by the shift of the beams from the symmetry axis 19b are suppressed.

Due to the size reducing imaging of the doublet 3b, beams which are deflected from the symmetry axis 19b in the mask plane 15b by the amount M impinge on the wafer 75 with a deflection of M/4. Accordingly, the beams do not pass centrally through the lens 7b of the doublet 7b either, and the lens 7b also comprises an axis shifting device 29b with two axis shifting coils 31b and 33b in order to shift the optical axis of the lens 7b from the symmetry axis 19b such that it coincides with the central beams of the deflected bundle of beams.

Figure 10:
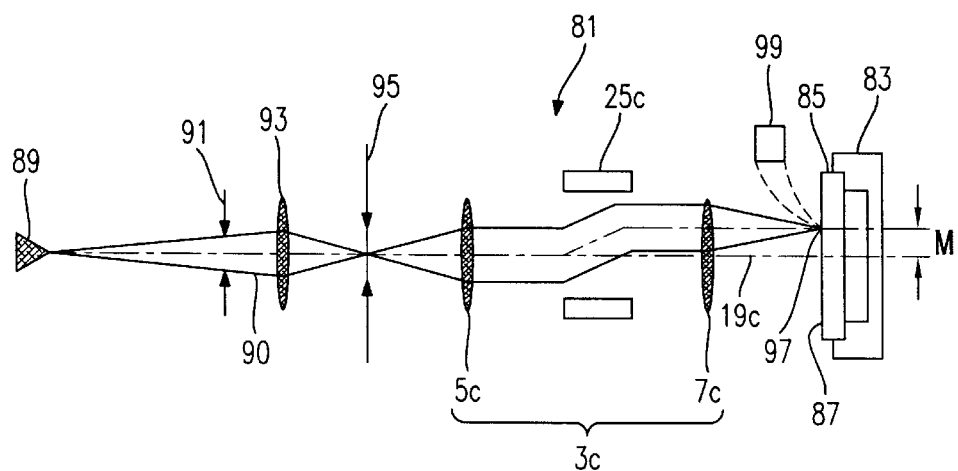
FIG. 10 schematically depicts the structure of an electron microscope which has integrated therein a further embodiment of the deflection arrangement according to one embodiment of the invention.

FIG. 10 shows an electron microscopy system 81 acting as a scanning electron microscope. It comprises a sample holder 83 for receiving a sample 85 with a sample surface 87 such that an area of the sample surface 87 to be examined is centered in respect of a main axis 19c of the microscope 81. An electron source 89 emits a diverging electron beam 90 which is defined by an aperture 91 and focused by a lens 93 such that a size-reduced image of the electron source 89 is formed in the plane of a scattered electron aperture 95. The size-reduced image of the electron source is imaged onto the sample surface 87 by means of a magnetic lens doublet 3c such that a spot as small as possible of the sample surface 87 is illuminated there in the area of a point 97. The electrons of the electron source 89 impinging on the sample surface 87 with an energy of 20 keV, for example, generate secondary electrons there which are attracted by means of an auxiliary field by an electron detector 99 and detected by the same.

The structure of the magnetic lens doublet 3c is substantially the same as that of the magnetic lens doublet shown in FIG. 1, and a deflection arrangement 25c is likewise provided in order to deflect the point 97 on the sample surface 87 illuminated by the electrons by a changeable amount M from the symmetry axis 19c. The lens 7c likewise comprises an axis shifting device, not shown in FIG. 10, so that also with comparatively large values of deflection M of the illuminated spot 97 from the main axis 19c a precise and finely focused imaging of the size-reduced image of the source 89 in the plane 95 and thus a high resolution of the electron microscope 89 is achievable.

The lens doublet 3c may be a symmetrical doublet, wherein the lenses 5c and 7c exhibit equal focal lengths. This is advantageous in so far as certain aberrations of the lenses 5c and/or 7c are compensated and a particularly finely focused image of the source can be produced on the sample surface 87 substantially independent of the deflection M. In particular, the use of a symmetrical magnetic lens doublet 3c for focusing renders it possible here to produce an image with particular little comatic aberrations. However, the doublet may also be of asymmetrical configuration, the focal lengths of the lenses 5c and 7c being different. Here, too, certain aberrations of the lens are partly compensated. In particular, the lens 7c then has a smaller focal length than the lens 5c so that a further size reduction of the image of the electron source 89 produced in the plane of the aperture 95 is produced on the sample surface 87.

Figure 11:
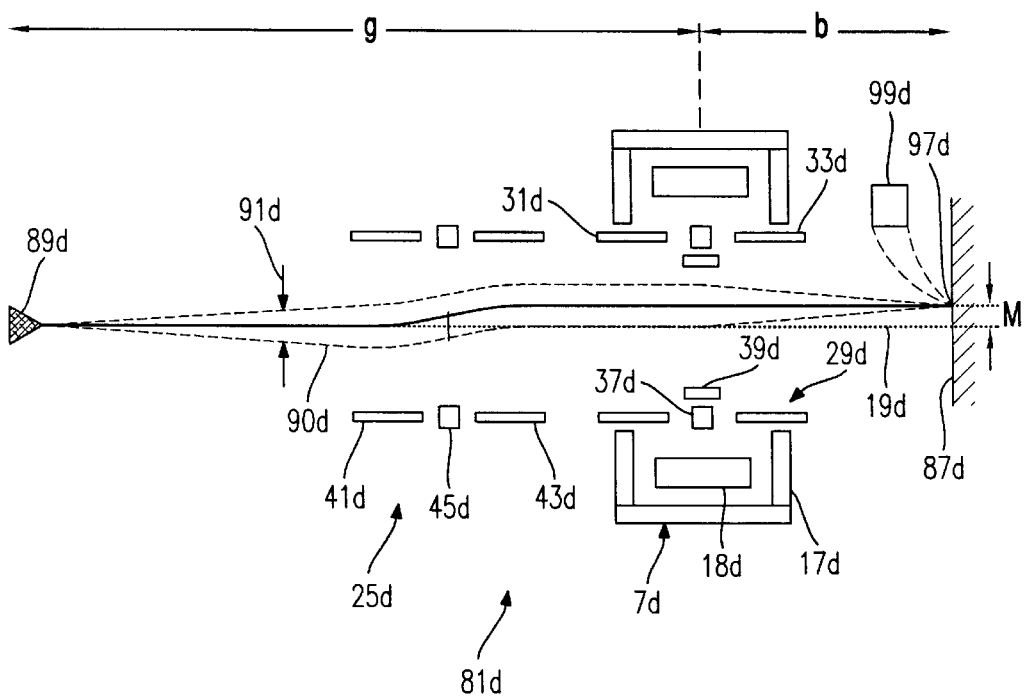
FIG. 11 likewise schematically depicts an electron microscope which has integrated therein a still further embodiment of the deflection arrangement according to one embodiment of the invention.

FIG. 11 shows a variant of the electron microscope shown in FIG. 10. In contrast to the microscope shown in FIG. 10, the electron microscope 81 of FIG. 11 has merely one focusing lens 7d in order to focus a divergent beam 90d emitted from an electron source 89d and shaped by an aperture 91d onto a sample surface 87d. The focusing lens 7d is centered in respect of a symmetry axis 19d, just as it is at first the beam 90d emitted from the electron source 89d. A deflection unit 25d is provided between the aperture 91d and the focusing lens 7d for shifting the beam 90d parallel to the symmetry axis 19d by an amount M. For this purpose, the deflection unit 25d comprises deflection coils 41d and 43d as well as a dynamic focusing coil 45d.

The electron beam shifted parallel from the symmetry axis 19d by the amount M then enters the focusing lens 7d which comprises an axis shifting device 29d in order to also deflect the center of the deflection field provided by the lens 7d from the symmetry axis 19d by the amount M in correspondence with the displaced electron beam. As a result, the effect of the lens 7d on the beam is the same as a centrally traversed focusing lens and a point 97d at which the beam is focused and impinges on the sample surface 87d is likewise deflected from the symmetry axis by the amount M. A distance g of the electron source 89d from the focusing lens 7d is selected larger than a distance b of the sample surface 87d from the focusing lens 7d so that the electron source 89d is imaged reduced in size onto the sample surface 87d in the area around the point 97d.

Figure 12:
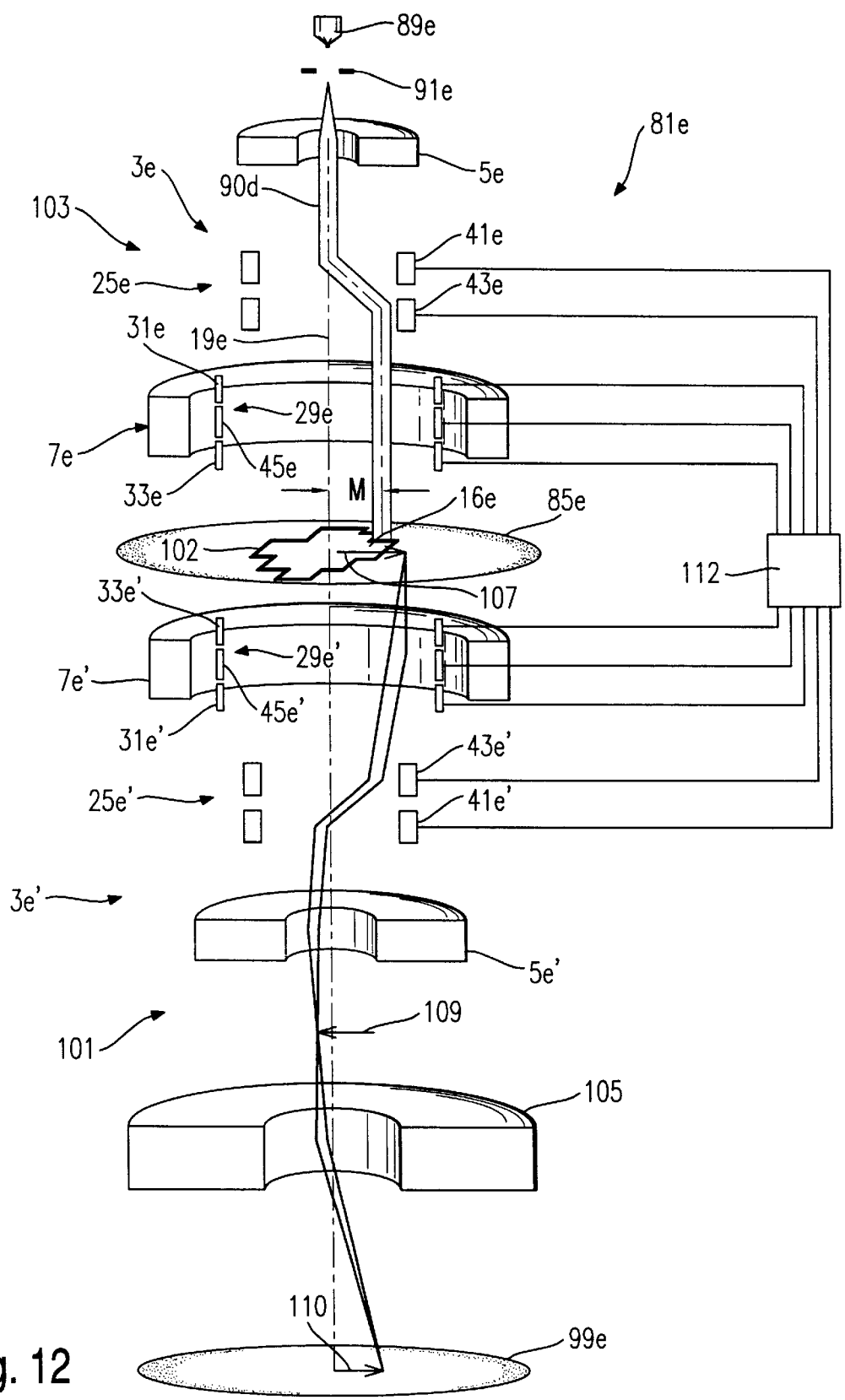
FIG. 12 shows a further electron microscope which has also integrated therein embodiments of the deflection arrangement according to one embodiment of the invention.

FIG. 12 shows an electron microscopy system 81e which acts as a transmission electron microscope. For his purpose, a sample 85e is illuminated by electrons from one side in an extended field 16e, and the transmission electrons passing through the sample 85e in the field 16e are imaged onto a position sensitive detector 99e by means of an imaging optical system 101. In the present case, the object 85e is a lithographic mask for imaging a structure 102 onto a wafer in a lithographic process. The quality of the structure 102 is examined by means of the electron microscope 81e. The imaging optical system 101 is provided such that the entire illuminated field 16e is imaged onto the detector 99e. Furthermore, the imaging optical system 101 is provided such that the field 16e which is imaged onto the detector 99e can be shifted from a symmetry axis 19e of the microscope 81e by an adjustable amount M. Accordingly, after the deflection M has been changed different areas of the sample 85e can be imaged successively, in terms of time, onto the detector 99e, so that altogether a comparatively large area of the sample 85e can be examined without having to mechanically move the sample relative to the microscope 81e.

Moreover, an illuminating system 103 for illuminating the area 16e imaged onto the detector 99e is provided such that it is not the entire sample surface 85e which is illuminated at the same time by electrons, but merely the area 16e which is imaged onto the detector 99e at a point in time. The illuminating optical system 103 comprises a focusing lens doublet 3e with focusing lenses 5e and 7e which are successively traversed by an electron beam 90d emitted by an electron source 89e and shaped by an aperture 91e. A deflection unit 25e comprising deflection coils 41e and 43e is provided between the two lenses 5e and 7e for shifting the beam 90d from the symmetry axis 19e by an amount M. The beam 90d shifted from the symmetry axis 19e then enters the second focusing lens 7e and is directed by the same onto the sample surface 85e such that merely the area 16e thereof is illuminated which is likewise shifted from the symmetry axis by the amount M. For this purpose, the focusing lens 7e comprises an axis shifting device 29e with two deflection coils 31e and 33e, a dynamically focusing coil 45e being likewise provided.

The imaging optical system 101 for imaging the transmission electrons emerging from the area 16e onto the detector 99e comprises a lens doublet 3e' as well as magnetic lens 105 for further magnification. The lens doublet 3e' is comprised of components which are positioned symmetrical to the components of the lens doublet 3e of the illuminating optical system 103 in respect of the sample. Moreover, a deflection unit 25e' is positioned between the lenses 7e' and 5e' of the doublet 3e', the components of which are likewise positioned symmetrical to the components of the deflection unit 25e in respect of the sample 85e. Due to this symmetry, the components of the lens doublet 3e' and the deflection unit 25e' of the imaging optical system 101 are designated with the same reference numerals as the corresponding components of the illuminating optical system 103, supplemented, however, by an apostrophe. The imaging optical system 101 images an object size 107 via an intermediate image 109 into an image 110 onto the detector 99e.

Reference number 112 in FIG. 12 refers to a control system which adjusts currents in the coils 41e, 43e, 31e, 33e, 45e and 33e', 31e', 45e', 43e' and 41e' such that both the illumination of the field 16e just as the imaging thereof onto the detector 99e is performed with high quality, while the field 16e is displaced from the symmetry axis 19e by the amount M.

As an alternative to the transmission electron microscope arrangement shown in FIG. 12, it is likewise possible to dispense with the controlled shifting of the illuminated field and to uniformly illuminate an area of the sample with electrons which is larger than the area momentarily imaged onto the detector. This simplifies the structure and control of the arrangement but may result in an increased thermal load of the sample.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A magnetic lens assembly for providing a magnetic deflection field for a beam of charged particles, comprising:
   a focusing lens device for providing a magnetic field which has substantially rotational symmetry in respect of a symmetry axis of the assembly and acts on the beam traversing said magnetic field as a focusing lens with an optical axis;
   an axis shifting device comprising at least one axis shifting coil for producing a corrective magnetic field which is superposable on the magnetic field provided by the focusing lens device and acts on the beam such that the optical axis is shiftable parallel to the symmetry axis of the assembly,
   wherein the axis shifting device comprises a first set of axially spaced apart rings which are positioned concentrically in respect of the symmetry axis and are made of a material which is substantially not electrically conductive and has a high magnetic permeability, wherein the at least one axis shifting coil is provided with a plurality of current conductor windings for producing the corrective magnetic field, and wherein the current conductor windings of the axis shifting coil engage around at least one of the rings of the first ring set; and
   at least one stigmator coil with a plurality of current conductor windings which engage around at least one of the rings of the first and second ring set.

2. The magnetic lens assembly according to claim 1, wherein a component of the corrective magnetic field transverse to the symmetry axis has a field strength distribution along the symmetry axis which is approximately proportional to a first derivative of a component parallel to the symmetry axis of the magnetic field provided by the focusing lens device along the symmetry axis.

3. The magnetic lens assembly according to claim 1, wherein the focusing lens device comprises two axially spaced apart pole ends facing towards the symmetry axis, and wherein the axis shifting device comprises an axis shifting coil which is associated to each pole end and positioned between pole end and symmetry axis.

4. The magnetic lens assembly according to claim 3, wherein a single axis shifting coil is associated to each pole end.

5. The magnetic lens assembly according to claim 3, wherein the axis shifting coil engages around one or more rings of the first set of rings.

6. The magnetic lens assembly according to claim 1, further comprising a second ring set of a plurality of axially spaced apart rings which are positioned concentrically in respect of the symmetry axis and are made of a material which is substantially not electrically conductive and has a high magnetic permeability, the second ring set being provided radially outside the rings of the first ring set around which the axis shifting coil engages.

7. The magnetic lens assembly according to claim 1, wherein a dynamic focusing coil is provided which is positioned between the stigmator coil and the symmetry axis.

8. The magnetic lens assembly according to claim 1, wherein a dynamic focusing coil is provided which is positioned radially inside the rings of the first ring set.

9. A deflection assembly for particle-optical imaging of a first cross-section of a beam of charged particles in a first plane to a second cross-section of the beam in a second plane, comprising:
   a magnetic lens doublet comprising a first focusing lens positioned between the first plane and the second plane and a second focusing lens positioned between the first focusing lens and the second plane, wherein the first and second focusing lenses are positioned on a common symmetry axis, wherein a symmetry plane of the doublet is positioned between the first and the second focusing lenses, wherein a distance between the first plane and the symmetry plane is twice as large as a focal length of the first focusing lens, and wherein a distance between the second plane and the symmetry plane is twice as large as a focal length of the second focusing lens; and
   a beam shifting assembly which is positioned between the first and the second focusing lenses and traversed by the beam for providing an adjustable axial shift between the beam entering the beam shifting assembly and the beam emerging therefrom,
   wherein at least one of the first focusing lens and the second focusing lens comprises an axis shifting device for providing a corrective magnetic field which is superposable on the magnetic field provided by the focusing lens and acts on the beam such that an optical axis of the focusing lens is shiftable parallel to the symmetry axis thereof.

10. The deflection assembly according to claim 9, wherein the beam shifting assembly comprises two deflection units positioned symmetrically in respect of the symmetry plane, each deflection unit providing a magnetic deflection field.

11. The deflection assembly according to claim 10, wherein the magnetic deflection field is produced by a deflection coil comprising a plurality of current conductor windings and engaging around at least one ring positioned concentrically in respect of the symmetry axis and made of a material which is substantially not electrically conductive and has a high magnetic permeability.

12. The deflection assembly according to claim 11, wherein a third set of axially spaced apart rings positioned concentrically in respect of the symmetry axis is provided, said rings being made of a material which is substantially not electrically conductive and has a high magnetic permeability, wherein the current conducting windings of the deflection coil engage around at least one of the rings of the third ring set.

13. The deflection assembly according to claim 12, wherein a magnetic field shield is provided radially outside the rings of the third ring set around which the deflection coil engages, said magnetic field shield comprising a material which is substantially not electrically conductive and has a high magnetic permeability.

14. The deflection assembly according to claim 13, wherein the magnetic field shield comprises an axially continuous cylinder or a plurality of axially spaced apart rings of a fourth ring set positioned concentrically in respect of the symmetry axis and made of a material which is substantially not electrically conductive and has a high magnetic permeability.

15. The deflection assembly according to claim 9, wherein at least one of the first and the second focusing lens comprises a magnetic lens assembly comprising
   a focusing lens device for providing a magnetic field which has substantially rotational symmetry in respect of a symmetry axis of the assembly and acts on a beam of charged particles traversing said magnetic field as a focusing lens with an optical axis; and an axis shifting device comprising at least one axis shifting coil for producing a corrective magnetic field which is superposable on the magnetic field provided by the focusing lens device and acts on the beam such that the optical axis is shiftable parallel to the symmetry axis of the assembly, wherein the axis shifting device comprises a first set of axially spaced apart rings which are positioned concentrically in respect of the symmetry axis and are made of a material which is substantially not electrically conductive and has a high magnetic permeability, wherein the at least one axis shifting coil is provided with a plurality of current conductor windings for producing the corrective magnetic field, and wherein the current conductor windings of the axis shifting coil engage around at least one of the rings of the first ring set.

16. A projection system for transferring a pattern defined on a mask to a particle-sensitive substrate by means of a beam of charged particles, the system comprising:

a source of charged particles;

a beam shaping aperture for shaping a cross-section of the particle beam;

a first particle-optical imaging apparatus for imaging the beam shaping aperture onto the mask; and a second particle-optical imaging apparatus for imaging the mask onto the substrate, wherein at least one of the first and the second particle-optical imaging apparatus comprises a magnetic lens assembly comprising a focusing lens device for providing a magnetic field which has substantially rotational symmetry in respect of a symmetry axis of the assembly and acts on a beam of charged particles traversing said magnetic field as a focusing lens with an optical axis;

an axis shifting device comprising at least one axis shifting coil for producing a corrective magnetic field which is superposable on the magnetic field provided by the focusing lens device and acts on the beam such that the optical axis is shiftable parallel to the symmetry axis of the assembly, wherein the axis shifting device comprises a first set of axially spaced apart rings which are positioned concentrically in respect of the symmetry axis and are made of a material which is substantially not electrically conductive and has a high magnetic permeability, wherein the at least one axis shifting coil is provided with a plurality of current conductor windings for producing the corrective magnetic field, and wherein the current conductor windings of the axis shifting coil engage around at least one of the rings of the first ring set; and at least one stigmator coil with a plurality of current conductor windings which engage around at least one of the rings of the first and second ring set.

17. A projection system for transferring a pattern defined on a mask to a particle-sensitive substrate by means of a beam of charged particles, the system comprising:

a source of charged particles;

a beam shaping aperture for shaping a cross-section of the particle beam;

a first particle-optical imaging apparatus for imaging the beam shaping aperture onto the mask; and a second particle-optical imaging apparatus for imaging the mask onto the substrate, wherein at least one of the first and the second particle-optical imaging apparatus comprises a deflection assembly comprising a magnetic lens doublet comprising a first focusing lens positioned between the first plane and the second plane and a second focusing lens positioned between the first focusing lens and the second plane, wherein the first and second focusing lenses are positioned on a common symmetry axis, wherein a symmetry plane of the doublet is positioned between the first and the second focusing lenses, wherein a distance between the first plane and the symmetry plane is twice as large as a focal length of the first focusing lens, and wherein a distance between the second plane and the symmetry plane is twice as large as a focal length of the second focusing lens; and a beam shifting assembly which is positioned between the first and the second focusing lenses and traversed by the beam for providing an adjustable axial shift between the beam entering the beam shifting assembly and the beam emerging therefrom, wherein at least one of the first focusing lens and the second focusing lens comprises an axis shifting device for providing a corrective magnetic field which is superposable on the magnetic field provided by the focusing lens and acts on the beam such that an optical axis of the focusing lens is shiftable parallel to the symmetry axis thereof.

18. The projection system according to claim 17, wherein the beam shaping aperture is positioned in the first plane of the magnetic lens doublet and the mask is positioned in the second plane of the magnetic lens doublet.

19. The projection system according to claim 17, wherein the mask is positioned in the first plane of the magnetic lens doublet and the substrate is positioned in the second plane of the magnetic lens doublet.

20. An electron microscopy system, comprising:

a sample holder for receiving a sample to be examined;

an electron source;

a focusing assembly for focusing electrons emitted from the electron source onto the sample; and a detector for detecting electrons emerging from the sample due to an interaction of the electrons focused onto the sample, wherein the focusing assembly comprises a magnetic lens assembly comprising a focusing lens device for providing a magnetic field which has substantially rotational symmetry in respect of a symmetry axis of the assembly and acts on a beam of charged particles traversing said magnetic field as a focusing lens with an optical axis; and an axis shifting device comprising at least one axis shifting coil for producing a corrective magnetic field which is superposable on the magnetic field provided by the focusing lens device and acts on the beam such that the optical axis is shiftable parallel to the symmetry axis of the assembly, wherein the axis shifting device comprises a first set of axially spaced apart rings which are positioned concentrically in respect of the symmetry axis and are made of a material which is substantially not electrically conductive and has a high magnetic permeability, wherein the at least one axis shifting coil is provided with a plurality of current conductor windings for producing the corrective magnetic field, and wherein the current conductor windings of the axis shifting coil engage around at least one of the rings of the first ring set.

21. An electron microscopy system, comprising:

a sample holder for receiving a sample to be examined;

an electron source;

a focusing assembly for focusing electrons emitted from the electron source onto the sample; and a detector for detecting electrons emerging from the sample due to an interaction of the electrons focused onto the sample, wherein the focusing assembly comprises a deflection assembly comprising a magnetic lens doublet comprising a first focusing lens positioned between the first plane and the second plane and a second focusing lens positioned between the first focusing lens and the second plane, wherein the first and second focusing lenses are positioned on a common symmetry axis, wherein a symmetry plane of the doublet is positioned between the first and the second focusing lenses, wherein a distance between the first plane and the symmetry plane is twice as large as a focal length of the first focusing lens, and wherein a distance between the second plane and the symmetry plane is twice as large as a focal length of the second focusing lens; and a beam shifting assembly which is positioned between the first and the second focusing lenses and traversed by the beam for providing an adjustable axial shift between the beam entering the beam shifting assembly and the beam emerging therefrom, wherein at least one of the first focusing lens and the second focusing lens comprises an axis shifting device for providing a corrective magnetic field which is superposable on the magnetic field provided by the focusing lens and acts on the beam such that an optical axis of the focusing lens is shiftable parallel to the symmetry axis thereof.

22. An electron microscopy system, comprising:

a sample holder for receiving a sample to be examined;

an electron source for illuminating the sample with electrons;

a position sensitive detector; and a lens assembly for imaging onto the position sensitive detector electrons emerging from the sample due to an interaction of the electrons focused onto the sample, wherein the lens assembly comprises a magnetic lens assembly comprising a focusing lens device for providing a magnetic field which has substantially rotational symmetry in respect of a symmetry axis of the assembly and acts on a beam of charge particles traversing said magnetic field as a focusing lens with an optical axis; and an axis shifting device comprising at least one axis shifting coil for producing a corrective magnetic field which is superposable on the magnetic field provided by the focusing lens device and acts on the beam such that the optical axis is shiftable parallel to the symmetry axis of the assembly, wherein the axis shifting device comprises a first set of axially spaced apart rings which are positioned concentrically in respect of the symmetry axis and are made of a material which is substantially not electrically conductive and has a high magnetic permeability, wherein the at least one axis shifting coil is provided with a plurality of current conductor windings for producing the corrective magnetic field, and wherein the current conductor windings of the axis shifting coil engage around at least one of the rings of the first ring set.

23. An electron microscopy system, comprising:

a sample holder for receiving a sample to be examined;

an electron source for illuminating the sample with electrons;

a position sensitive detector; and a lens assembly for imaging onto the position sensitive detector electrons emerging from the sample due to an interaction of the electrons focused onto the sample, wherein the lens assembly comprises a deflection assembly comprising a magnetic lens doublet comprising a first focusing lens positioned between the first plane and the second plane and a second focusing lens positioned between the first focusing lens and the second plane, wherein the first and second focusing lenses are positioned on a common symmetry axis, wherein a symmetry plane of the doublet is positioned between the first and the second focusing lenses, wherein a distance between the first plane and the symmetry plane is twice as large as a focal length of the first focusing lens, and wherein a distance between the second plane and the symmetry plane is twice as large as a focal length of the second focusing lens; and a beam shifting assembly which is positioned between the first and the second focusing lenses and traversed by the beam for providing an adjustable axial shift between the beam entering the beam shifting assembly and the beam emerging therefrom, wherein at least one of the first focusing lens and the second focusing lens comprises an axis shifting device for providing a corrective magnetic field which is superposable on the magnetic field provided by the focusing lens and acts on the beam such that an optical axis of the focusing lens is shiftable parallel to the symmetry axis thereof.

24. The projection system according to claim 16, wherein a component of the corrective magnetic field transverse to the symmetry axis has a field strength distribution along the symmetry axis which is approximately proportional to a first derivative of a component parallel to the symmetry axis of the magnetic field provided by the focusing lens device along the symmetry axis.

25. The projection system according to claim 16, wherein the focusing lens device comprises two axially spaced apart pole ends facing towards the symmetry axis, and wherein the axis shifting device comprises an axis shifting coil which is associated to each pole end and positioned between pole end and symmetry axis.

26. The projection system according to claim 25, wherein a single axis shifting coil is associated to each pole end.

27. The projection system according to claim 25, wherein the axis shifting coil engages around one or more rings of the first set of rings.

28. The projection system according to claim 16, further comprising a second ring set of a plurality of axially spaced apart rings which are positioned concentrically in respect of the symmetry axis and are made of a material which is substantially not electrically conductive and has a high magnetic permeability, the second ring set being provided radially outside the rings of the first ring set around which the axis shifting coil engages.

29. The projection system according to claim 16, wherein a dynamic focusing coil is provided which is positioned between the stigmator coil and the symmetry axis.

30. The projection system according to claim 16, wherein a dynamic focusing coil is provided which is positioned radially inside the rings of the first ring set.

31. The projection system according to claim 17, wherein the beam shifting assembly comprises two deflection units positioned symmetrically in respect of the symmetry plane, each deflection unit providing a magnetic deflection field.

32. The projection system according to claim 31, wherein the magnetic deflection field is produced by a deflection coil comprising a plurality of current conductor windings and engaging around at least one ring positioned concentrically in respect of the symmetry axis and made of a material which is substantially not electrically conductive and has a high magnetic permeability.

33. The projection system according to claim 32, wherein a third set of axially spaced apart rings positioned concentrically in respect of the symmetry axis is provided, said rings being made of a material which is substantially not electrically conductive and has a high magnetic permeability, wherein the current conducting windings of the deflection coil engage around at least one of the rings of the third ring set.

34. The projection system according to claim 33, wherein a magnetic field shield is provided radially outside the rings of the third ring set around which the deflection coil engages, said magnetic field shield comprising a material which is substantially not electrically conductive and has a high magnetic permeability.

35. The projection system according to claim 34, wherein the magnetic field shield comprises an axially continuous cylinder or a plurality of axially spaced apart rings of a fourth ring set positioned concentrically in respect of the symmetry axis and made of a material which is substantially not electrically conductive and has a high magnetic permeability.

36. The projection system according to claim 17, wherein at least one of the first and the second focusing lens comprises a magnetic lens assembly comprising:
  a focusing lens device for providing a magnetic field which has substantially rotational symmetry in respect of a symmetry axis of the assembly and acts on a beam of charged particles traversing said magnetic field as a focusing lens with an optical axis; and
  an axis shifting device comprising at least one axis shifting coil for producing a corrective magnetic field which is superposable on the magnetic field provided by the focusing lens device and acts on the beam such that the optical axis is shiftable parallel to the symmetry axis of the assembly,
  wherein the axis shifting device comprises a first set of axially spaced apart rings which are positioned concentrically in respect of the symmetry axis and are made of a material which is substantially not electrically conductive and has a high magnetic permeability, wherein the at least on axis shifting coil is provided with a plurality of current conductor windings for producing the corrective magnetic field, and wherein the current conductor windings of the axis shifting coil engage around at least one of the rings of the first ring set.

37. The electron microscopy system according to claim 20, wherein a component of the corrective magnetic field transverse to the symmetry axis has a field strength distribution along the symmetry axis which is approximately proportional to a first derivative of a component parallel to the symmetry axis of the magnetic field provided by the focusing lens device along the symmetry axis.

38. The electron microscopy system according to claim 20, wherein the focusing lens device comprises two axially spaced apart pole ends facing towards the symmetry axis, and wherein the axis shifting device comprises an axis shifting coil which is associated to each pole end and positioned between pole end and symmetry axis.

39. The electron microscopy system according to claim 38, wherein a single axis shifting coil is associated to each pole end.

40. The electron microscopy system according to claim 38, wherein the axis shifting coil engages around one or more rings of the first set of rings.

41. The electron microscopy system according to claim 20, further comprising a second ring set of a plurality of axially spaced apart rings which are positioned concentrically in respect of the symmetry axis and are made of a material which is substantially not electrically conductive and has a high magnetic permeability, the second ring set being provided radially outside the rings of the first ring set around which the axis shifting coil engages.

42. The electron microscopy system according to claim 20, further comprising at least one stigmator coil with a plurality of current conductor windings which engage around at least one of the rings of the first and second ring set.

43. The electron microscopy system according to claim 42, wherein a dynamic focusing coil is provided which is positioned between the stigmator coil and the symmetry axis.

44. The electron microscopy system according to claim 20, wherein a dynamic focusing coil is provided which is positioned radially inside the rings of the first ring set.

45. The electron microscopy system according to claim 22, wherein a component of the corrective magnetic field transverse to the symmetry axis has a field strength distribution along the symmetry axis which is approximately proportional to a first derivative of a component parallel to the symmetry axis of the magnetic field provided by the focusing lens device along the symmetry axis.

46. The electron microscopy system according to claim 22, wherein the focusing lens device comprises two axially spaced apart pole ends facing towards the symmetry axis, and wherein the axis shifting device comprises an axis shifting coil which is associated to each pole end and positioned between pole end and symmetry axis.

47. The electron microscopy system according to claim 46, wherein a single axis shifting coil is associated to each pole end.

48. The electron microscopy system according to claim 46, wherein the axis shifting coil engages around one or more rings of the first set of rings.

49. The electron microscopy system according to claim 22, further comprising a second ring set of a plurality of axially spaced apart rings which are positioned concentrically in respect of the symmetry axis and are made of a material which is substantially not electrically conductive and has a high magnetic permeability, the second ring set being provided radially outside the rings of the first ring set around which the axis shifting coil engages.

50. The electron microscopy system according to claim 22, further comprising at least one stigmator coil with a plurality of current conductor windings which engage around at least one of the rings of the first and second ring set.

51. The electron microscopy system according to claim 50, wherein a dynamic focusing coil is provided which is positioned between the stigmator coil and the symmetry axis.

52. The electron microscopy system according to claim 22, wherein a dynamic focusing coil is provided which is positioned radially inside the rings of the first ring set.

53. The electron microscopy system according to claim 21, wherein the beam shifting assembly comprises two deflection units positioned symmetrically in respect of the symmetry plane, each deflection unit providing a magnetic deflection field.

54. The electron microscopy system according to claim 53, wherein the magnetic deflection field is produced by a deflection coil comprising a plurality of current conductor windings and engaging around at least one ring positioned concentrically in respect of the symmetry axis and made of a material which is substantially not electrically conductive and has a high magnetic permeability.

55. The electron microscopy system according to claim 54, wherein a third set of axially spaced apart rings positioned concentrically in respect of the symmetry axis is provided, said rings being made of a material which is substantially not electrically conductive and has a high magnetic permeability, wherein the current conducting windings of the deflection coil engage around at least one of the rings of the third ring set.

56. The electron microscopy system according to claim 55, wherein a magnetic field shield is provided radially outside the rings of the third ring set around which the deflection coil engages, said magnetic field shield comprising a material which is substantially not electrically conductive and has a high magnetic permeability.

57. The electron microscopy system according to claim 56, wherein the magnetic field of a fourth ring set positioned concentrically in respect of the symmetry axis and made of a material which is substantially not electrically conductive and has a high magnetic permeability.

58. The electron microscopy system according to claim 21, wherein at least one of the first and the second focusing lens comprises a magnetic lens assembly comprising:

a focusing lens device for providing a magnetic field which has substantially rotational symmetry in respect of a symmetry axis of the assembly and acts on a beam of charged particles traversing said magnetic field as a focusing lens with an optical axis; and an axis shifting device comprising at least one axis shifting coil for producing a corrective magnetic field which is superposable on the magnetic field provided by the focusing lens device and acts on the beam such that the optical axis is shiftable parallel to the symmetry axis of the assembly, wherein the axis shifting device comprises a first set of axially spaced apart rings which are positioned concentrically in respect of the symmetry axis and are made of a material which is substantially not electrically conductive and has a high magnetic permeability, wherein the at least on axis shifting coil is provided with a plurality of current conductor windings for producing the corrective magnetic field, and wherein the current conductor windings of the axis shifting coil engage around at least one of the rings of the first ring set.

59. The electron microscopy system according to claim 23, wherein the beam shifting assembly comprises two deflection units positioned symmetrically in respect of the symmetry plane, each deflection unit providing a magnetic deflection field.

60. The electron microscopy system according to claim 59, wherein the magnetic deflection field is produced by a deflection coil comprising a plurality of current conductor windings and engaging around at least one ring positioned concentrically in respect of the symmetry axis and made of a material which is substantially not electrically conductive and has a high magnetic permeability.

61. The electron microscopy system according to claim 60, wherein a third set of axially spaced apart rings positioned concentrically in respect of the symmetry axis is provided, said rings being made of a material which is substantially not electrically conductive and has a high magnetic permeability, wherein the current conducting windings of the deflection coil engage around at least one of the rings of the third ring set.

62. The electron microscopy system according to claim 61, wherein a magnetic field shield is provided radially outside the rings of the third ring set around which the deflection coil engages, said magnetic field shield comprising a material which is substantially not electrically conductive and has a high magnetic permeability.

63. The electron microscopy system according to claim 62, wherein the magnetic field shield comprises an axially continuous cylinder or a plurality of axially spaced apart rings of a fourth ring set positioned concentrically in respect of the symmetry axis and made of a material which is substantially not electrically conductive and has a high magnetic permeability.

64. The electron microscopy system according to claim 23, wherein at least one of the first and the second focusing lens comprises a magnetic lens assembly comprising:

a focusing lens device for providing a magnetic field which has substantially rotational symmetry in respect of a symmetry axis of the assembly and acts on a beam of charged particles traversing said magnetic field as a focusing lens with an optical axis; and an axis shifting device comprising at least one axis shifting coil for producing a corrective magnetic field which is superposable on the magnetic field provided by the focusing lens device and acts on the beam such that the optical axis is shiftable parallel to the symmetry axis of the assembly, wherein the axis shifting device comprises a first set of axially spaced apart rings which are positioned concentrically in respect of the symmetry axis and are made of a material which is substantially not electrically conductive and has a high magnetic permeability, wherein the at least on axis shifting coil is provided with a plurality of current conductor windings for producing the corrective magnetic field, and wherein the current conductor windings of the axis shifting coil engage around at least one of the rings of the first ring set.

\* \* \* \* \*

UNITED STATES PATENT AND TRADEMARK OFFICE
CERTIFICATE OF CORRECTION

PATENT NO. : 6,642,525 B2
DATED : November 4, 2003
INVENTOR(S) : Oliver Kienzle et al.

It is certified that error appears in the above-identified patent and that said Letters Patent is hereby corrected as shown below:

Column 19,
Line 58, replace "on" with -- one --.

Column 21,
Line 33, after "FIELD", insert -- shield comprises an axially continuous cylinder of a plurality of axially spaced apart rings --.
Line 56, replace "on" with -- one --.

Column 22,
Line 55, replace "on" with -- one --.

Signed and Sealed this

Twenty-seventh Day of April, 2004

JON W. DUDAS
*Acting Director of the United States Patent and Trademark Office*